United States Patent [19]

Obara et al.

[11] 4,258,260

[45] Mar. 24, 1981

[54] PYROELECTRIC INFRARED DETECTOR

[75] Inventors: Hiroshi Obara; Tetuaki Kon; Naohiro Murayama, all of Iwaki, Japan

[73] Assignee: Kureha Kagaku Kogyo Kabushiki Kaisha, Tokyo, Japan

[21] Appl. No.: 41,066

[22] Filed: May 21, 1979

[30] Foreign Application Priority Data

May 31, 1978 [JP] Japan ............................. 53-73403[U]

[51] Int. Cl.³ .............................................. G01J 1/00
[52] U.S. Cl. .................................................. 250/338
[58] Field of Search ............... 250/338, 340, 342, 370; 73/355 R, 362 CP

[56] References Cited

U.S. PATENT DOCUMENTS

| 3,453,432 | 7/1969 | McHenry | 250/338 |
| 3,707,695 | 12/1972 | Yamaka | 250/338 |
| 3,877,308 | 4/1975 | Taylor | 250/338 |
| 3,971,250 | 7/1976 | Taylor | 73/355 R |

FOREIGN PATENT DOCUMENTS 5299869  8/1977  Japan .

*Primary Examiner*—Davis L. Willis
*Assistant Examiner*—Janice A. Howell
*Attorney, Agent, or Firm*—Wegner & Bretschneider

[57] ABSTRACT

This invention concerns a pyroelectric infrared detector, comprising a substrate and polymeric pyroelectric elements mounted to both surfaces of the substrate, in which the electrode plates on one of the polymeric pyroelectric element are connected electrically to the electrode plates of opposite polarities on the other of the polymeric pyroelectric elements respectively.

8 Claims, 7 Drawing Figures

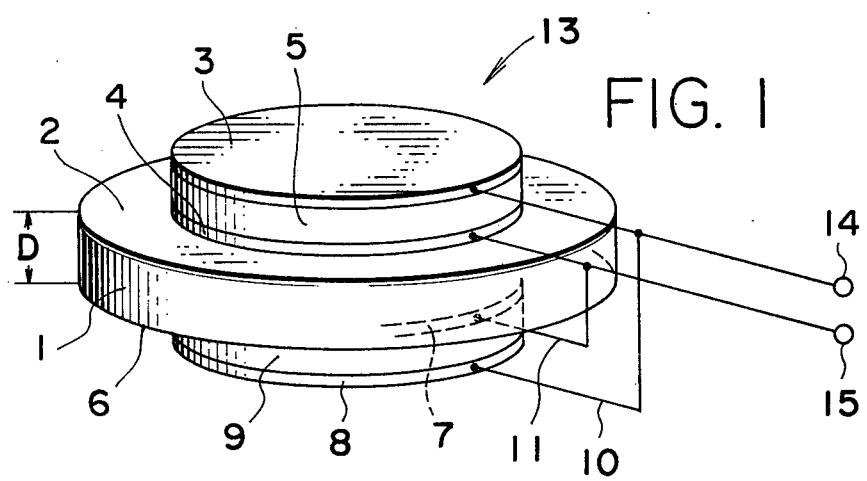
FIG. 1
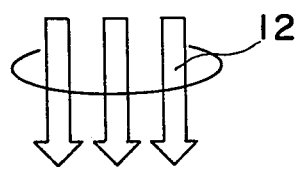
FIG. 2
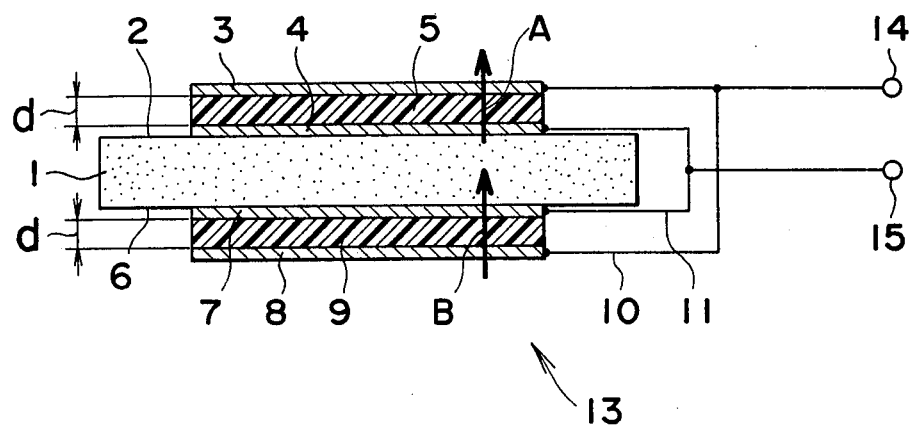

PYROELECTRIC INFRARED DETECTOR

BACKGROUND OF THE INVENTION

This invention concerns a pyroelectric infrared detector and, more specifically, an infrared detector using polymeric pyroelectric elements.

It is well known that certain types of polymer such as polyvinylidene fluoride, polyvinyl fluoride and the like show both pyroelectric and piezoelectric properties when subjected to poling procession and, due to their easy processability, wide variety of application uses are considered.

Infrared detectors constituted with these polymers as pyroelectric elements are, however, defective in that electric signals produced from piezoelectric effect due to mechanical actions such as vibration or bending are much greater than electric signals produced from pyroelectric effect due to incident infrared rays and S/N ratio as the infrared detector is very poor as compared with detectors using ferroelectric ceramics as pyroelectric elements. In order to overcome such defects, a detector using a pair of elements overlapped and connected to each other at their electrodes of same polarities so that the piezoelectricity caused by the bending of the elements may be offset are disclosed, for example, in Japanese Patent Laying Open No. 99869/1977, but the piezoelectricity resulted from the strain in the elements along the thickness can not be offset and the S/N ratio for the electric signals obtained from the infrared detector is not yet satisfactory.

An object of this invention is to provide a pyroelectric infrared detector in which signal to noise ratio in the electric signals can be improved significantly.

Another object of this invention is to provide a pyroelectric infrared detector having a highly excellent detection sensitivity for infrared irradiation.

A further object of this invention is to provide a pyroelectric infrared detector which can reduce electric signals resulted from piezoelectric effect due to mechanical actions applied thereto and process a satisfactory S/N ratio even placed under the conditions where many vibrations are present.

A further object of this invention is to provide a pyroelectric infrared detector which can offset electric signals resulted from pyroelectric effect due to fluctuations in the atmospheric temperature and electric signals resulted from piezoelectric effect due to compression strains respectively.

A still further object of this invention is to provide a pyroelectric infrared detector which has a good processability and can be formed in a small size.

In accordance with this invention, a pyroelectric infrared detector is provided which comprises a substrate and polymeric pyroelectric elements each having electrode plates on both surfaces thereof and mounted to both surfaces of the substrate and in which electrode plates on one of the pyroelectric elements are connected electrically to the electrode plates of opposite polarities on the other of the pyroelectric elements, the thickness of the substrate is greater than the thickness of the pyroelectric elements and infrared rays are adapted to irradiate on one of the pyroelectric elements.

The substrate having a thickness greater than that of the pyroelectric element is, desirably, formed so that the product of the modulus of elasticity and the thickness is great. In preferred embodiments, the substrate can be formed so that its product of the modulus of elasticity and the thickness is greater than that of the pyroelectric element by a factor of 5, preferably, 10 and, more preferably, 20. Materials usable herein for the substrate can include, for example, metal, glass, ceramics, plastics or rubber, and the substrate is preferably prepared from materials having modulus of elasticity greater than that of the polymeric pyroelectric element.

The polymeric pyroelectric element having electrode plates provided on both surfaces thereof can be formed by orienting and polarizing a polymer film or membrane made of a homopolymer such as polyvinylidene fluoride or polyvinyl fluoride, a copolymer comprising vinylidene fluoride or vinyl fluoride as a main component, or a polymer blend comprising either of the above homopolymer or copolymer as a main component. In a preferred embodiment, the film- or membrane-like pyroelectric element is preferably formed to a thickness of 1 to 100 $\mu$m and more preferably 2 to 50 $\mu$m.

Materials for the electrode plates provided to both surfaces to the polymeric pyroelectric element usable herein include gold, silver, nickel-chromium alloy, aluminum or carbon and the electrode plates are formed through vapor deposition of these materials on the pyroelectric element or through bonding of a film or membrane made of these materials on the pyroelectric element. In a preferred embodiment, the electrode plates are formed to a thickness approximately equal to or less than the thickness of the pyroelectric element. In a further preferred embodiment, the electrode plates are preferably formed to a thickness of 10 Å to 2000 Å, and more preferably 50 Å to 1000 Å so that the heat generated by infrared irradiation is preferably conducted to the pyroelectric element. In another preferred embodiment, the electrode plate used as the incident surface of the infrared radiation can be prepared from materials transmittable to infrared rays, for example, a transparent material so that the irradiated infrared rays can transmit it and directly reach the pyroelectric element.

In the electrode plates thus formed, the electrode plates on one of the polymeric pyroelectric elements are connected electrically to the electrode plates of opposite polarities on the other of the pyroelectric elements, for example, by way of lead wires. The electrode plate of the opposite polarity means herein, for example, an electrode plate on which electric charges such as positive or negative charges different from those on the other electrode plate are induced due to pyroelectric when infrared rays are irradiated on both of the pyroelectric elements to result in temperature increase in the same direction in both of the pyroelectric elements and thus produce pyroelectricity in each of the pyroelectric elements.

In a preferred embodiment of this invention, polymeric pyroelectric elements are disposed so that the electrode plates of each of the polymeric pyroelectric elements contacting to the surfaces of the substrate show the polarities opposite to each other. By disposing each of the pyroelectric elements in such a manner, the electrode plates on the sides contacting to the surfaces of the substrate can be set in common to each of the pyroelectric elements, which, as the result, enables to use a substrate prepared by vapor depositing or bonding a conductive membrane or layer as the electrode plate over the entire outer surface or a substrate made of a conductive material also serving as the electrode plate. This can save lead wires for connection. In another preferred embodiment, each of the elements is mounted to the substrate so that the electrode plates on each of the pyroelectric elements contacting to the surfaces of the substrate are on the same polarity.

An infrared detector is constituted by adapting to irradiate infrared rays on one of the pyroelectric elements mounted to both surfaces of the substrate. The incident infrared rays may be focussed by way of a lens or specific spectrum components therein may be removed through color filters. Moreover, infrared rays may be irradiated merely through a transparent glass plate or irradiated directly.

DESCRIPTION OF ACCOMPANYING DRAWINGS

This invention is to be described by way of a preferred embodiment referring to the accompanying drawings, by which these and other objects and features of this invention will be made more clear, in which:

FIG. 1 is a perspective view of pyroelectric infrared detector as a preferred embodiment of this invention;

FIG. 2 is a cross sectional view of the detector shown in FIG. 1;

PREFERRED EMBODIMENT

Figure 3:
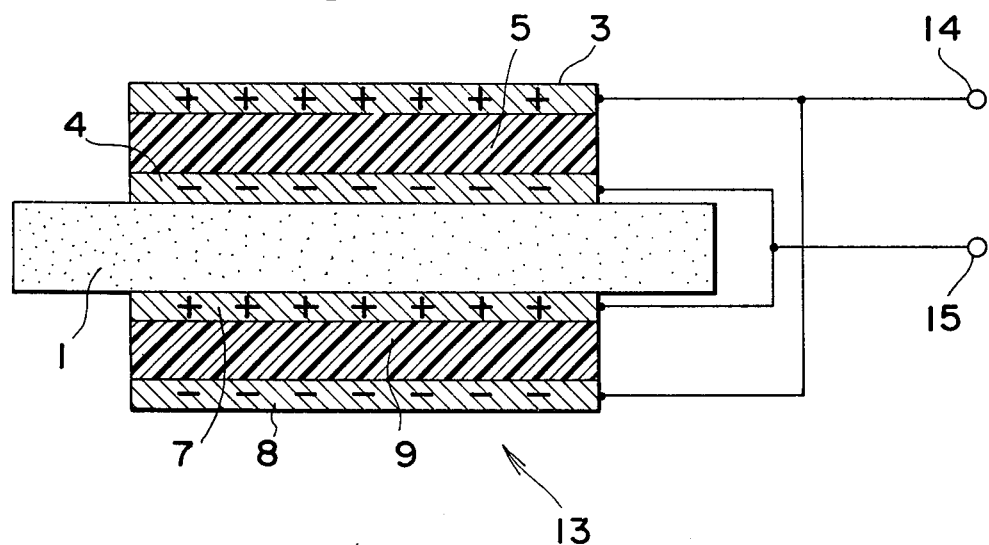
FIG. 3 and FIG. 4 are views illustrating the operation of the detector shown in FIG. 1.

In FIG. 1 and FIG. 2, a disc-like substrate 1 made of ceramics is mounted on its one surface 2 with a pyroelectric element 5 having thin film electrode plates 3 and 4. The disc-like pyroelectric element 5 is formed, for example, by orienting and polarizing a film made of a polymeric material such as polyvinylidene fluoride thereby applying it pyroelectric property. The pyroelectric element 5 is mounted to the substrate 1 generally by applying adhesives between the electrode plate 4 and the substrate 1 to secure the electrode plate 4 to the substrate 1 where electrode plates 3 and 4 are previously formed on both surfaces of the pyroelectric element 5 through vapor deposition of gold or silver, or by applying adhesives between the pyroelectric element 5 and the electrode plate 4 to secure the pyroelectric element 5 to the electrode plate 4 where the electrode plate 4 is previously formed on the surface 2 of the substrate 1 through vapor deposition of gold or silver.

The incident infrared radiation is generally rendered intermittent by chopper means because the pyroelectric element produces pyroelectricity corresponding to the differentiation value with respect to the changes in temperature.

The thickness D of the substrate 1 is formed greater than the thickness d of the element 5, and the product of the modulus of elasticity and the thickness D of the substrate 1 may be set greater than the product of the modulus of elasticity and the thickness d of the element 5 by a factor of 5, 10 or 20. The pyroelectric element 9 having electrode plates 7 and 8 is mounted to the outer surface 6 of the substrate 1. While the pyroelectric element 9 and the electrode plates 7 and 8 are formed respectively in the same manner as the pyroelectric element 5 and the electrode plates 3 and 4, the pyroelectric element 9 is mounted to the substrate 1 so that the element 9 is polarized in the direction shown by an arrow B where the element 5 is polarized in the direction of an arrow A. With the pyroelectric elements 5 and 9 mounted respectively on both surfaces of the substrate 1 in such a manner, the electrode plate 3 on one element 5 and the electrode plate 8 on the other element 9 are connected by way of a lead wire 10, while the electrode plate 4 on the element 5 and the electrode plate 7 on the other element 9 are connected by way of a lead wire 11. That is, the electrode plate 3 is connected to the electrode plate 8 of the opposite polarity and the electrode plate 4 is connected to the electrode plate 7 of the opposite polarity respectively by way of the lead wires 10 and 11. With the substrate 1 and the pyroelectric elements 5 and 9 thus assembled, an infrared detector 13 is formed by adapting to irradiate infrared rays 12, for example, on the side of the pyroelectric element 5.

Since the pyroelectric elements 5 and 9 are supported on the substrate 1, vibrations or sonic waves are applied, for example, to the detector 13 as described above, bending of the pyroelectric elements 5 and 9 is suppressed, thus, the value of the piezoelectricity caused by the bending is negligible and no substantial electric charges are induced to the electrode plates 3 and 4, as well as 7 and 8.

If compression waves in air such as sonic waves are applied to the detector 13, compression strains are produced equally along the thickness of each of the pyroelectric elements 5 and 9, by which positive electric charges are induced to the electrode plates 3 and 7 and negative electric charges are induced to the electrode plates 4 and 8 respectively, for example, as shown in FIG. 3. Since the electrode plates 3 and 8 are connected by way of the lead wire 10 and the electrode plates 4 and 7 are connected by way of the lead wire 11 respectively in the detector 13, the electric charges induced to these electrode plates are offset to each other.

While on the other hand, if electric charges are induced to each of the electrode plates resulted from the pyroelectric effect due to fluctuations in the atmospheric temperature as shown in FIG. 3, these electric charges are also offset in the same manner. Consequently, no substantial electric noise signals resulted from the piezoelectricity due to bending or compression strain or the pyroelectricity due to fluctuations in the atmospheric temperature are produced at all between terminals 14 and 15 connected respectively to the lead wires 10 and 11.

Figure 4:
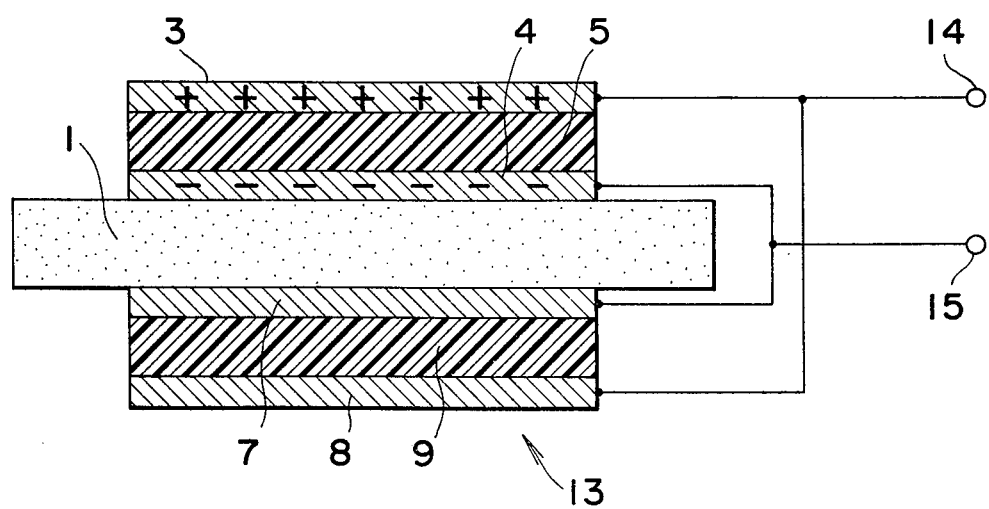

While on the other hand, upon irradiation of the infrared rays 12, since only the pyroelectric element 5 is heated, positive and negative electric charges resulted from pyroelectricity are induced respectively to the electrode plates 3 and 4 as shown in FIG. 4. Consequently, electric signals due to infrared radiation can be obtained between the terminals 14 and 15.

More specifically, since the infrared radiation and the heat conduction to the pyroelectric element 9 are substantially interrupted by the substrate 1, no substantial charges are induced to the electrode plates 7 and 8 in the irradiation of the infrared rays 12. Consequently, electric charges induced in the electrode plates 3 and 4 are not offset to each other but produce as they are as electric signals between the terminals 14 and 15. As foregoings, in the detector 13, since the noise signals can substantially be lowered and, on the other hand, electric signals due to infrared radiation to be detected can be issued as they are, S/N ratio in the required electric signals can be improved significantly.

Figure 5:
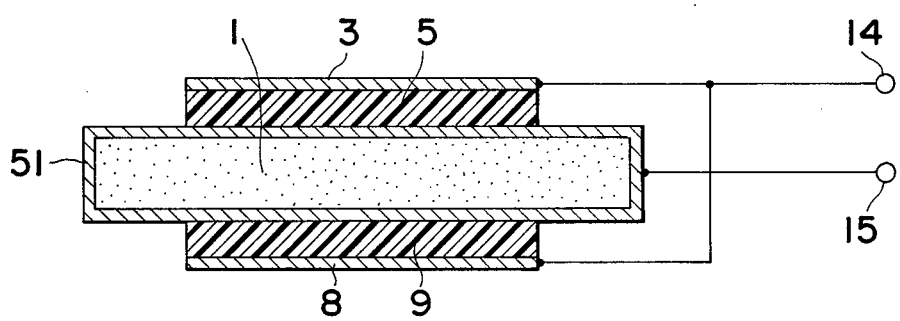
FIG. 5 is a cross sectional view of another embodiment of this invention.

While the electrode plates 4 and 7 are disposed separately from each other in the foregoing embodiment, an electrode layer 51 may be formed entirely on the outer surface of the substrate 1 and used as the opposing electrode plate for both of the pyroelectric elements 5 and 9, for example, as shown in FIG. 5. Provision of the electrode plate in such a manner can save the lead wire and the wiring work for the lead wire to thereby improve the processability.

In this embodiment, the electrode layer 51 is not necessarily formed for the entire outer surface of the substrate 1 but it may be formed in the same area as that of the pyroelectric elements 5 and 9 at the portion facing to the pyroelectric elements 5 and 9 while formed as a strip at other portions. Electrical connection of the electrode layers on the side of the pyroelectric element 5 and on the side of the pyroelectric element 9 by way of the strip can improve the processability, as well as preferably reduce the heat conduction from the electrode layer on the pyroelectric element 5 to the electrode layer on the pyroelectric element 9, by which the changes in the temperature can be produced only on the side of the pyroelectric element 5 upon infrared irradiation.

Figure 6:
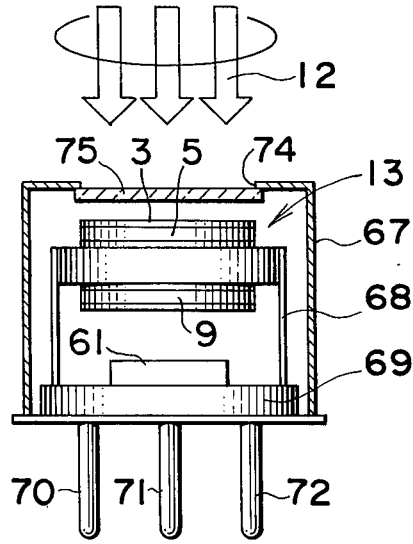
FIG. 6 is an explanatory view for the cross section of an infrared detector, in which the detector shown in FIG. 1 and an impedance converter are mounted in combination in a canned casing.
Figure 7:
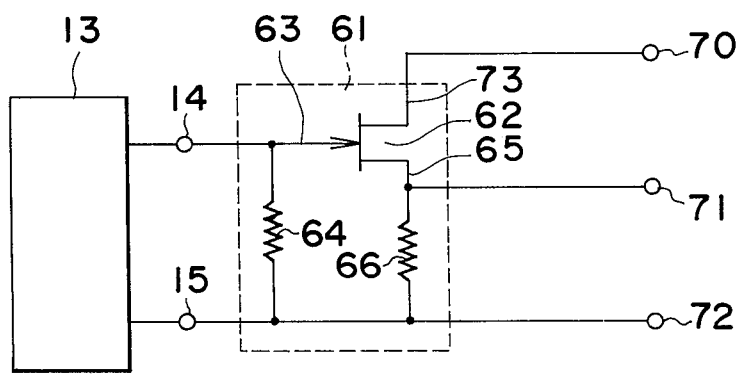
FIG. 7 is a circuit diagram for the impedance converter for use with the detector shown in FIG. 6.

As shown in FIG. 6 and FIG. 7, the detector 13 can be used in combination with an impedance converter 61 in a canned casing. The impedance converter 61 shown in FIG. 6 and FIG. 7 comprises an N type field effect transistor 62, a resistor 64 connected at one end to the gate 63 of the transistor 62, and a resistor 66 connected at one end to the source 65 of the transistor 62, in which each of the other ends of the resistors 64 and 66 are connected. The converter 61 and the detector 13 constituted as above are combined to the detector 13 by connecting the terminal 14 to the gate 63 and the terminal 15 to joined ends of the resistors 64 and 66 (wiring connection is not shown in FIG. 6). The detector 13 mounted in the casing 67 is supported by way of a support 68 on the stem 69 and the converter 61 is also secured on the stem 69. The stem 69 is provided with terminals 70, 71 and 72, the terminal 70 being connected to the drain 73 of the transistor 62, the terminal 71 being connected to the source 65 of the transistor 62 and the terminal 72 being connected to joined ends of the resistors 64 and 66 respectively. The top of the canned casing 67 opposing to the pyroelectric element 5 is formed with a window 74, which is provided with a material 75 composed of silicon, germanium or the like that can transmit infrared rays.

By mounting the detector 13 and the impedance converter 61 formed as a source follower integratedly in the canned case 67 and combining them, electric signals caused by infrared radiation more excellent in the S/N ratio can be issued from the terminal 71. In the use of the device shown in FIG. 6, a DC power source is connected between the terminals 70 and 72. The casing 67 is preferably formed not only to inhibit incidence of infrared rays to the pyroelectric element 5 except from the window 74 but also to cut off any vibration with directional qualities i.e. sound wave. However, there may be provided with some small apertures on the casing as long as the said effects substantially are shown to a considerable extent.

Further, when the external atmosphere is isolated completely, it is preferable to seal inert gas such as argon and nitrogen so as to prevent from oxidizing the electrodes and the like.

What is claimed is:

1. A pyroelectric infrared detector comprising a substrate and polymeric pyroelectric elements mounted to both surfaces of the substrate, each of said elements having electrode plates provided on both surfaces thereof, in which electrode plates on one of the polymeric pyroelectric elements are electrically connected to the electrode plates of opposite polarities on the other of the polymeric pyroelectric elements respectively, the produce of the modulus of elasticity and the thickness of the substrate being greater by a factor of 5 than the product of the modulus of elasticity and the thickness of each of the pyroelectric elements, whereupon infrared radiation is applied to one of the pyroelectric elements, and said pyroelectric element is prevented from bending and the effects of piezoelectricity resulting from the compression strains along the thickness of the elements are compensated.

2. The pyroelectric infrared detector of claim 1, in which the product of the modulus of elasticity and the thickness of the substrate is greater by a factor of 10 than the product of the modulus of elasticity and the thickness of each of the pyroelectric elements.

3. The pyroelectric infrared detector of claim 1, in which the product of the modulus of elasticity and the thickness of the substrate is greater by a factor of 20 than the product of the modulus of elasticity and the thickness of each of the pyroelectric elements.

4. The pyroelectric infrared detector of claim 1, in which the electrode plates on each of the polymeric pyroelectric elements that contact the surfaces of the substrate are of polarities opposite to each other.

5. The pyroelectric infrared detector of claim 1, in which the electrode plates on each of the polymeric pyroelectric elements that contact the surfaces of the substrate are of a polarity equal to each other.

6. The pyroelectric infrared detector of claim 1, in which both polymeric pyroelectric elements are mounted inside a casing sealed by inlet gas.

7. The pyroelectric infrared detector of any one of the claims 1 to 6 in which the pyroelectric element comprises a polyvinylidene fluoride film which is oriented and polarized.

8. The pyroelectric infrared detector of any one of claims 1 to 6, in which the pyroelectric element comprises a polyvinyl fluoride film which is oriented and polarized.

* * * * *